United States Patent
Backman et al.

(10) Patent No.: US 6,266,545 B1
(45) Date of Patent: Jul. 24, 2001

(54) TRANSFERRING DATA IN A FIXED-SITE RADIO TRANSCEIVER STATION BY MODULATING POWER SUPPLY CURRENT

(75) Inventors: Ulf Backman, Hagersten; Sven Nilsson, Stockholm, both of (SE)

(73) Assignee: Telefonaktiebolaget LM Ericsson (publ) (SE)

(*) Notice: Subject to any disclaimer, the term of this patent is extended or adjusted under 35 U.S.C. 154(b) by 0 days.

(21) Appl. No.: 09/176,667

(22) Filed: Oct. 21, 1998

(51) Int. Cl.$^7$ ........................................ H04B 1/38
(52) U.S. Cl. .................. 455/572; 455/571; 455/573; 455/575; 455/127; 455/561
(58) Field of Search .................. 455/572, 571, 455/573, 127, 575, 574, 561, 562; 330/136, 10, 207 A, 251

(56) References Cited

U.S. PATENT DOCUMENTS

| | | | |
|---|---|---|---|
| 3,988,676 | 10/1976 | Whang | 325/38 A |
| 4,086,587 | 4/1978 | Lender | 340/347 DD |
| 4,292,633 | * 9/1981 | Goodwin, Jr. et al. | 340/870.39 |
| 4,618,941 | 10/1986 | Linder et al. | 364/724 |
| 5,280,500 | 1/1994 | Mazzola et al. | 375/17 |
| 5,303,395 | * 4/1994 | Dayani | 455/127 |
| 5,457,814 | * 10/1995 | Myrskog et al. | 455/127 |
| 5,533,054 | 7/1996 | DeAndrea et al. | 375/286 |
| 5,784,409 | 7/1998 | Coles | 375/286 |
| 5,995,813 | * 11/1999 | Ishikura et al. | 455/127 |

FOREIGN PATENT DOCUMENTS

| | | | |
|---|---|---|---|
| 0589574 | 3/1994 | (EP) | H03G/3/20 |
| 0599659 | 6/1994 | (EP) | H04B/7/26 |
| 0708527 | 4/1996 | (EP) | H03G/3/20 |

* cited by examiner

Primary Examiner—Daniel Hunter
Assistant Examiner—Lane Le
(74) Attorney, Agent, or Firm—Jenkens & Gilchrist

(57) ABSTRACT

In a fixed-site radio transceiver station, information about a tower-mounted radio frequency amplifier apparatus can be automatically transferred from the tower-mounted radio frequency amplifier apparatus to another portion of the fixed-site radio transceiver station. The information is transferred by modulating a power supply current that is drawn from the other portion by the tower-mounted radio frequency amplifier apparatus.

16 Claims, 6 Drawing Sheets

TRANSFERRING DATA IN A FIXED-SITE RADIO TRANSCEIVER STATION BY MODULATING POWER SUPPLY CURRENT

FIELD OF THE INVENTION

The invention relates generally to fixed-site radio transceiver stations and, more particularly, to data transfer in fixed-site radio transceiver stations.

BACKGROUND OF THE INVENTION

In conventional fixed-site radio transceiver stations (also referred to as base transceiver stations or base stations) used in wireless communication networks, the radio antenna and an associated amplifier are typically mounted high atop a tower structure, and connected to the remainder of the base transceiver station via a radio frequency (RF) feeder cable. The RF feeder cable is also conventionally used to supply DC power supply current to the tower mounted amplifier (TMA).

FIG. 1 is a block diagram of one example of the above-described conventional base transceiver station, for example a base transceiver station used in a conventional GSM (Global System for Mobile communications) wireless communications network. The example of FIG. 1 shows the tower mounted amplifier 11 of the base station connected to the remainder 13 of the base station by RF feeder cable 15. The remainder portion 13 includes a TMA power supply 17 for providing DC power supply current for use by the tower mounted amplifier TMA. The remainder portion 13 also includes a so-called "bias Tee" module 19 connected to the TMA power supply 17 and also connected to an RF signalling path 12 which is in turn coupled to a radio transceiver (XCVR) of the base station.

The bias Tee module 19 is a conventional apparatus which combines both the RF signalling from RF signalling path 12 and the DC power supply current from the TMA power supply 17 in the RF feeder cable 15. The RF feeder cable 15 provides RF signalling and DC power supply current to the tower mounted amplifier TMA. The bias Tee module 19 of the remainder portion 13 also separates RF signalling received via RF feeder cable 15 from the power supply current in the RF feeder cable 15. The bias Tee module described above is a conventional apparatus well known to workers in the art.

The tower mounted amplifier 11 also includes a bias Tee module 19 for separating the RF signalling from the DC power supply current in the RF feeder cable 15, and for permitting RF signalling from signal path 14 to be transmitted back to the remainder portion 13 via the RF feeder cable 15 while the cable 15 also carries the DC power supply current. The bias Tee module 19 provides the DC power supply current to the local power supply 16 of the tower mounted amplifier TMA. The local power supply 16 provides the tower mounted amplifier TMA with the necessary DC power supply current.

In conventional base transceiver stations such as illustrated in FIG. 1, the tower mounted amplifier TMA is typically designed so that, should a fault occur in the TMA, it will typically be detectable at the remainder portion 13 by detecting changes in the power supply current drawn by the tower mounted amplifier 11 from the TMA power supply 17 of the remainder portion 13. Such changes in current are conventionally detected by a data processor 20 which receives a digital input from an A/D converter 21 whose analog input is coupled to the DC power supply current output 24 of the TMA power supply 17.

The tower mounted amplifier TMA includes an amplifier AMP that is coupled to the RF signalling path 14 and to a tower mounted antenna for appropriately amplifying RF signals that are received (Rx) by the tower mounted antenna. RF signals to be transmitted (Tx) by the antenna are typically filtered and applied to a booster before antenna transmission. Such filter and booster functions can be built into the conventional amplifier unit AMP. The tower mounted amplifier TMA of FIG. 1 has associated therewith TMA parameter data which can represent, for example, information associated with the TMA such as product information, serial numbers, filter frequency information, amplifier gain information, alarm limits, etc. When a fixed-site radio transceiver station such as illustrated in FIG. 1 (or at least the TMA thereof) is newly installed, the TMA parameter data is typically input manually to the remainder portion 13 (e.g., to the data processor 20). However, if a new tower mounted amplifier TMA is added, or if the existing TMA is replaced, then the parameter data associated with the added/replacement TMA must disadvantageously be manually input to the remainder portion 13 of the fixed-site transceiver. This is both costly and time-consuming.

It is desirable in view of the foregoing to avoid the delay and expense of manually inputting TMA parameter data to the remainder portion 13 of the base transceiver station whenever a new or replacement tower mounted amplifier TMA is installed.

According to the present invention, a tower mounted amplifier can automatically signal the parameter data of the tower mounted amplifier to the remainder portion of the base transceiver station using a power supply current path coupled between the tower mounted amplifier and the remainder portion.

DETAILED DESCRIPTION

Figure 1:
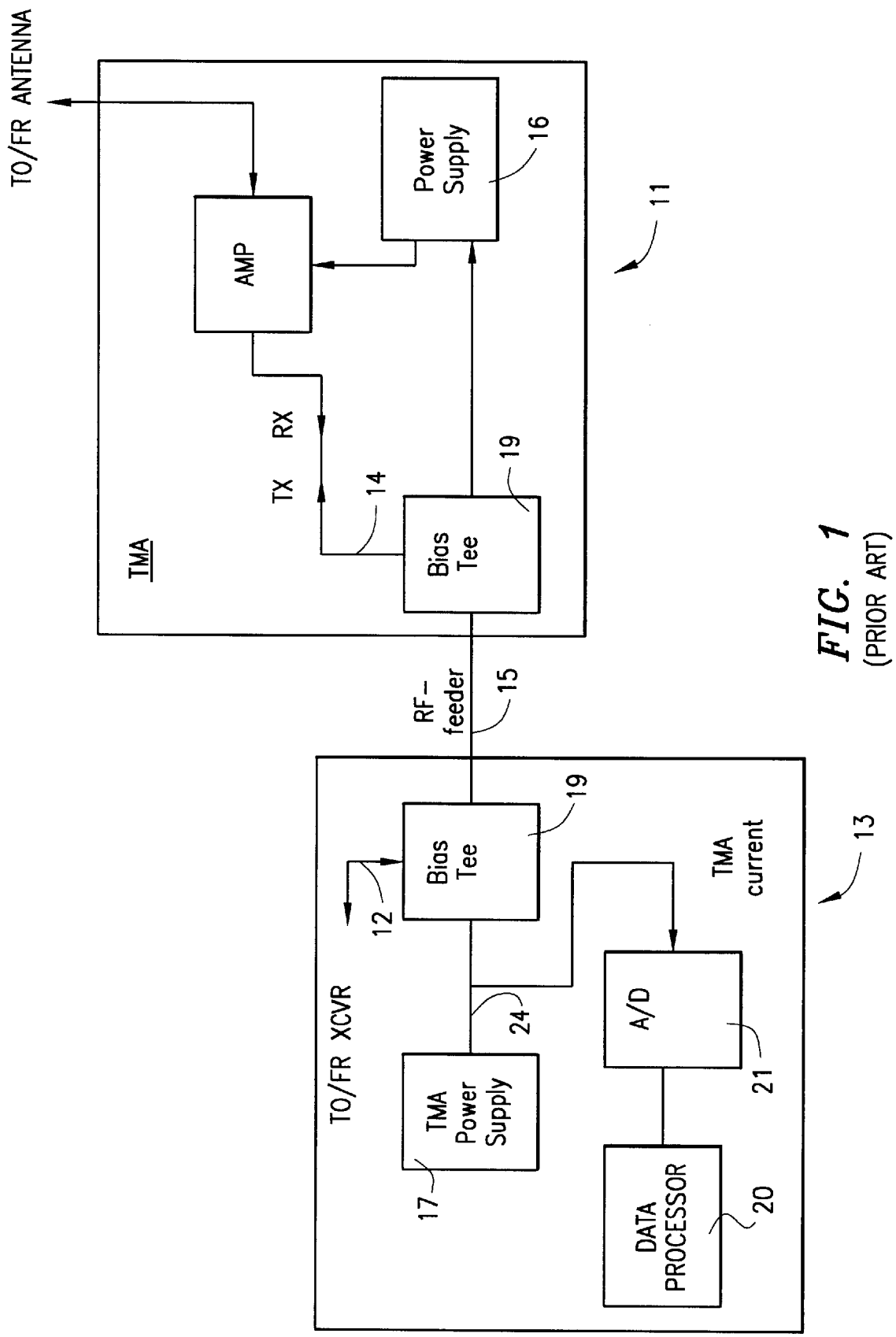
FIG. 1 illustrates pertinent portions of a conventional base transceiver station for use in a wireless communication system.
Figure 2:
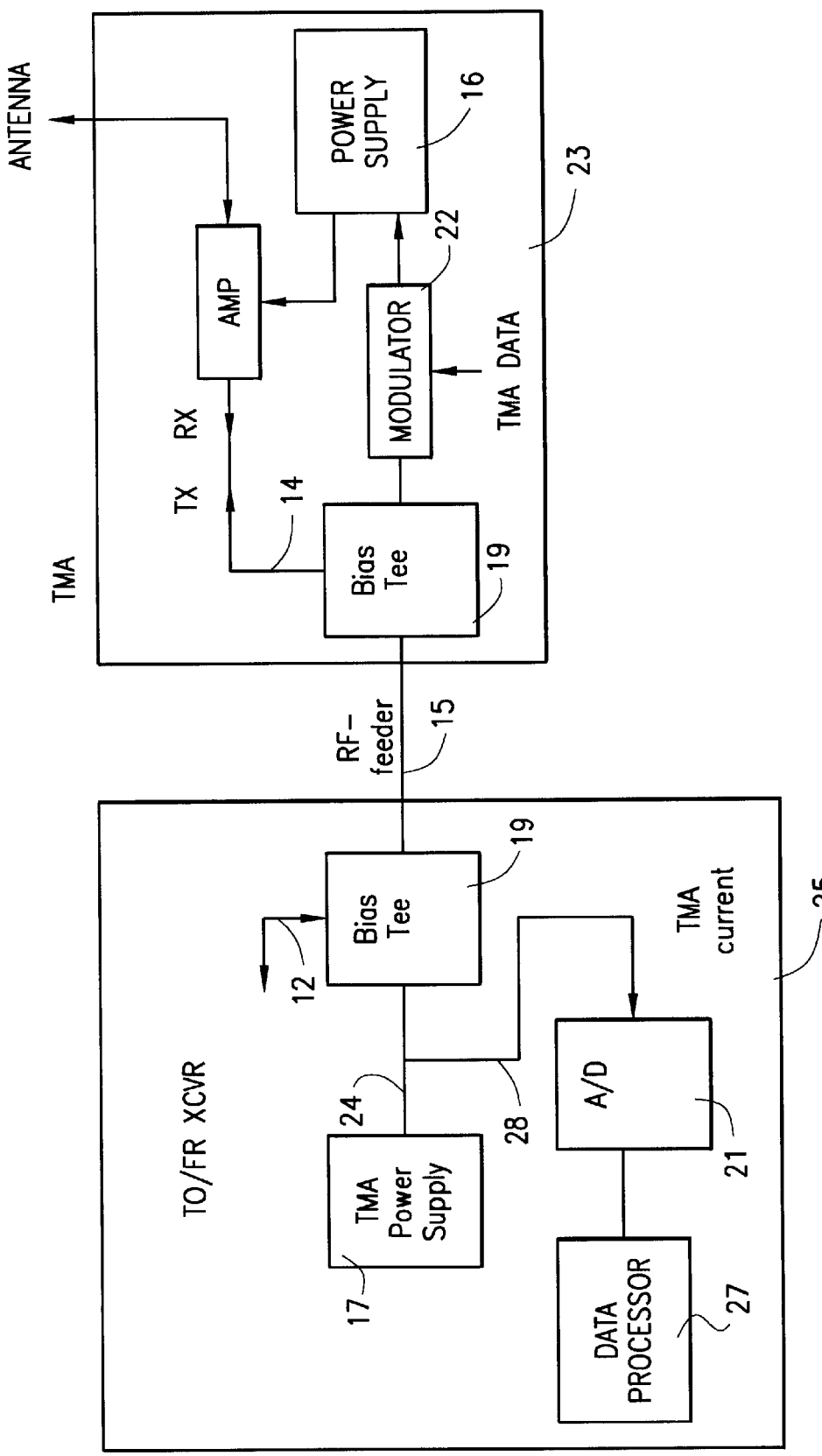
FIG. 2 illustrates pertinent portions of an example base transceiver station according to the present invention.

FIG. 2 illustrates diagrammatically pertinent portions of an example base transceiver station according to the invention. The base transceiver station of FIG. 2, which could be used in, for example, a GSM network, includes a tower mounted amplifier (TMA) 23 and a remainder portion 25. The tower mounted amplifier portion 23 of FIG. 2 includes a power supply current modulator 22 coupled between the bias Tee module 19 and the local power supply 16. The modulator 22 uses the TMA parameter data to modulate the power supply current drawn from the TMA power supply 17 (through RF feeder 15) by the tower mounted amplifier portion 23.

The power supply current drawn from the TMA power supply 17 is monitored by an A/D converter 21 coupled to the TMA power supply output 24, and the digital output of the A/D converter is input to a data processor 27 coupled to the A/D converter. The data processor 27 interprets the digital data received from the A/D converter to thereby recover the TMA parameter data as modulated by modulator 22 onto the TMA power supply current drawn from the TMA power supply 17. The A/D converter 21 and data processor 27 thus detect and decode the TMA parameter data as modulated onto the TMA power supply current.

The power supply current modulator 22 of FIG. 2 causes the power supply current drawn from the TMA power supply 17 to vary among a plurality of distinct current levels in response to the TMA parameter data input to the modulator 22. The various current levels are used to represent the TMA parameter data. In order to ensure that the A/D converter 21 can properly resolve the differences between the various current levels used to represent the TMA parameter data, adjacent ones of current levels seen by the A/D converter 21 should preferably be separated from one another by a known minimum amount. The smallest possible separation between two current levels is dependent on the accuracy specifications of (1) the A/D converter 21 and (2) conventional signal conditioning circuits (not shown) included in the current path 28 coupling the TMA power supply 17 to the A/D converter 21.

Assume, for example, that the current level seen by the A/D converter can be expected to be within a ±7 mA uncertainty range of the actual current level output by the TMA power supply 17. Assume also for this example that 8 distinct current levels are to be used to transfer the TMA parameter data. A suitable separation between adjacent current levels can then be calculated by subtracting the lowest of the current levels from the highest of the current levels, and dividing the result by 8. The aforementioned ±7 mA uncertainty range introduces an error of ±14/8 mA (=±1.75 mA) into the aforementioned calculation of the separation between adjacent current levels. Thus, a total uncertainty of ±8.75 mA (±7 mA±1.75 mA) must be accounted for when calculating the current level separation.

Assuming also for this example that the A/D converter has a maximum step size of 3.5 mA/step, the aforementioned ±8.75 mA range requires ±3 steps of the A/D converter. Thus, each current level used in the TMA data transfer should be preferably centered in a current level decision interval which extends at least 3 steps of the A/D converter above and at least 3 steps of the A/D converter below that current level. In this example, one additional step is added between adjacent intervals to ensure separation of the adjacent intervals.

Figure 3:
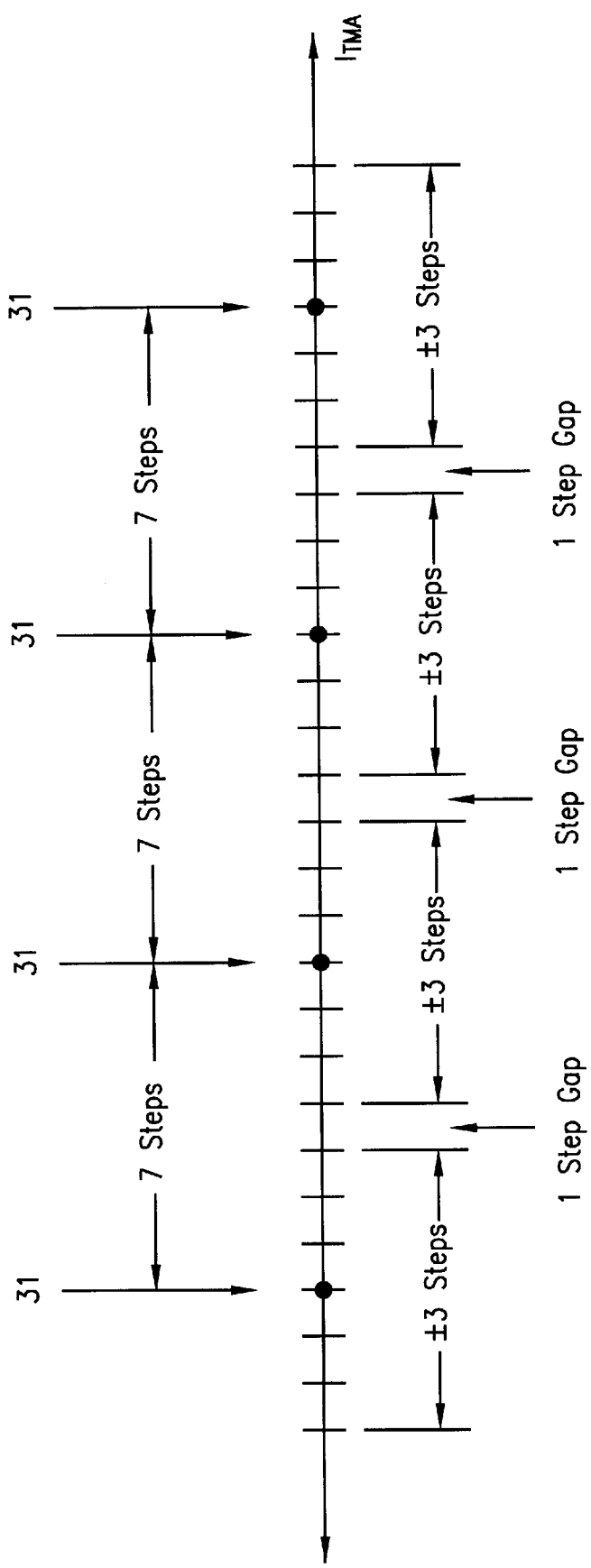
FIG. 3 illustrates a plurality of nominal power supply current levels used to transmit on the RF feeder cable of FIG. 2 parameter data associated with the tower mounted amplifier of FIG. 2.

FIG. 3 illustrates the above-described example of current levels for use in transferring the TMA parameter data. As shown in FIG. 3, each current level 31 is centered in an interval which extends three steps above and three steps below the current level, and each interval is separated from each adjacent interval by a one step gap. Accordingly, each current level is separated from the next adjacent current level by seven steps, which corresponds in this example to 24.5 mA (7 steps×3.5 mA/step).

Figure 4:
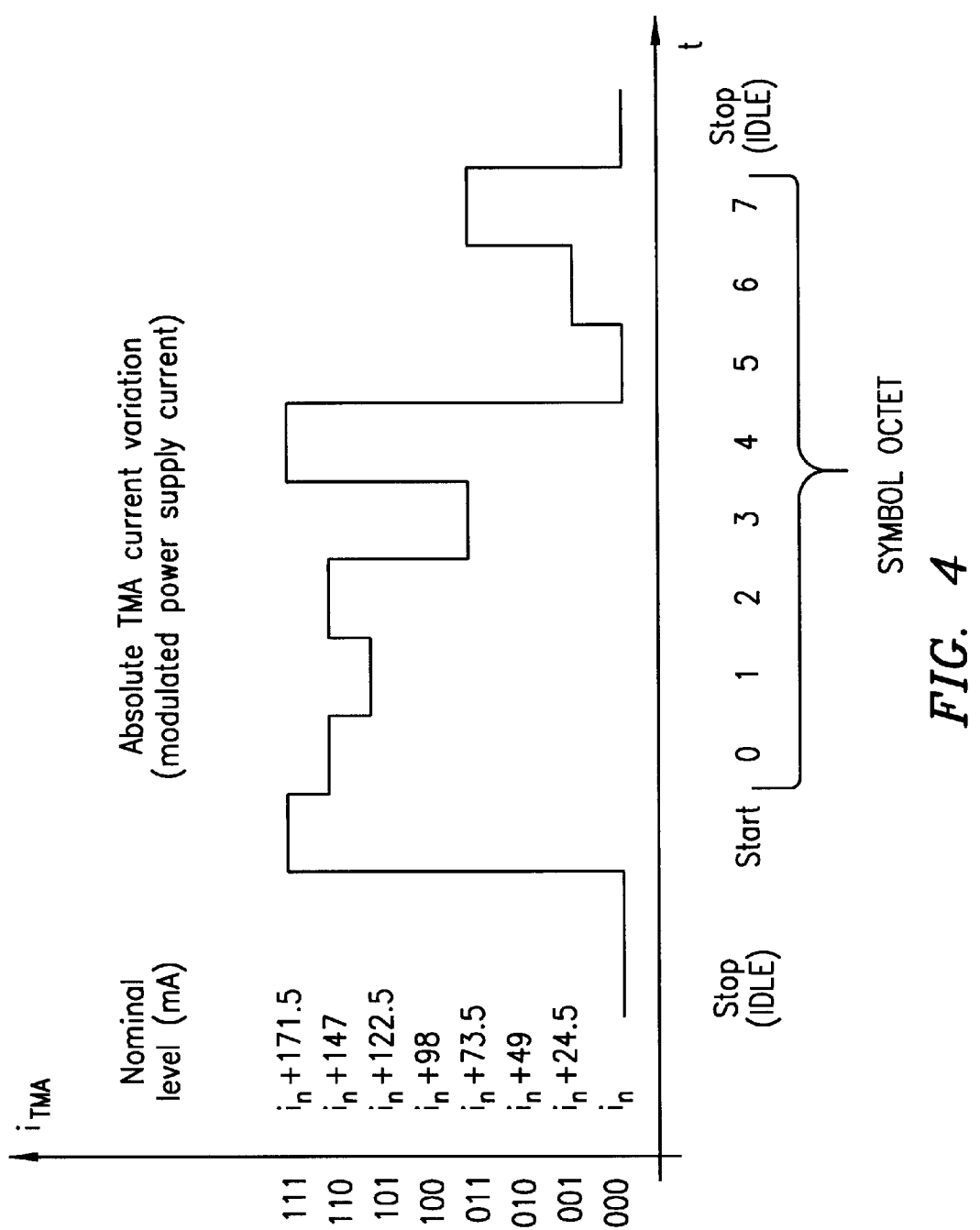
FIG. 4 illustrates how the current levels of FIG. 3 can be used to transmit multiple level coded data on the RF feeder of FIG. 2.

FIG. 4 illustrates an example current waveform representing the power supply current $i_{TMA}$ drawn from (output by) the TMA power supply 17 in response to operation of the power supply current modulator 22 of FIG. 2. The diagram of FIG. 4 illustrates eight current levels, thus providing eight possible signalling symbols. In the example of FIG. 4, $i_n$ represents the nominal TMA power supply current drawn by the tower mounted amplifier portion 23 under normal conventional operating conditions, and the remaining current levels are defined by the aforementioned 24.5 mA separations. In FIG. 4, the highest current level, $i_n$+171.5 mA, represents a start symbol, and the nominal current level $i_n$ represents a stop (or idle) symbol. In this example, eight symbol times (designated 0–7) exist between the start and stop symbols, so a symbol octet including eight separate symbols can be transferred during the time between the start and stop symbols. The minimum possible length of the symbol times is determined by the speed of A/D converter 21 and the limits imposed by the RF feeder cable 15 and path 28.

Also according to the invention, multiple level coding can be utilized in conjunction with the modulation of TMA parameter data. For example, using the eight current levels of FIG. 4, each current level can represent a three bit symbol as shown in FIG. 4. Thus, in FIG. 4, the symbol transmitted during symbol time 0 corresponds to 110, the symbol transmitted during symbol time 1 corresponds to 101, the symbol transmitted during symbol time 2 corresponds to 110, the symbol transmitted during symbol time 3 corresponds to 011, the symbol transmitted during symbol time 4 corresponds to 111, the symbol transmitted during symbol time 5 corresponds to 000, the symbol transmitted during symbol 6 corresponds to 001 and the symbol transmitted during symbol time 7 corresponds to 011. Thus, the received pattern of bits in this example will be 1101 0111 0011 1110 0000 1011. Such multiple level coding greatly increases data throughput, and can be easily interpreted by data processor 27 which can be, for example, a digital signal processor, a microprocessor, or another suitable data processing apparatus.

Figure 5:
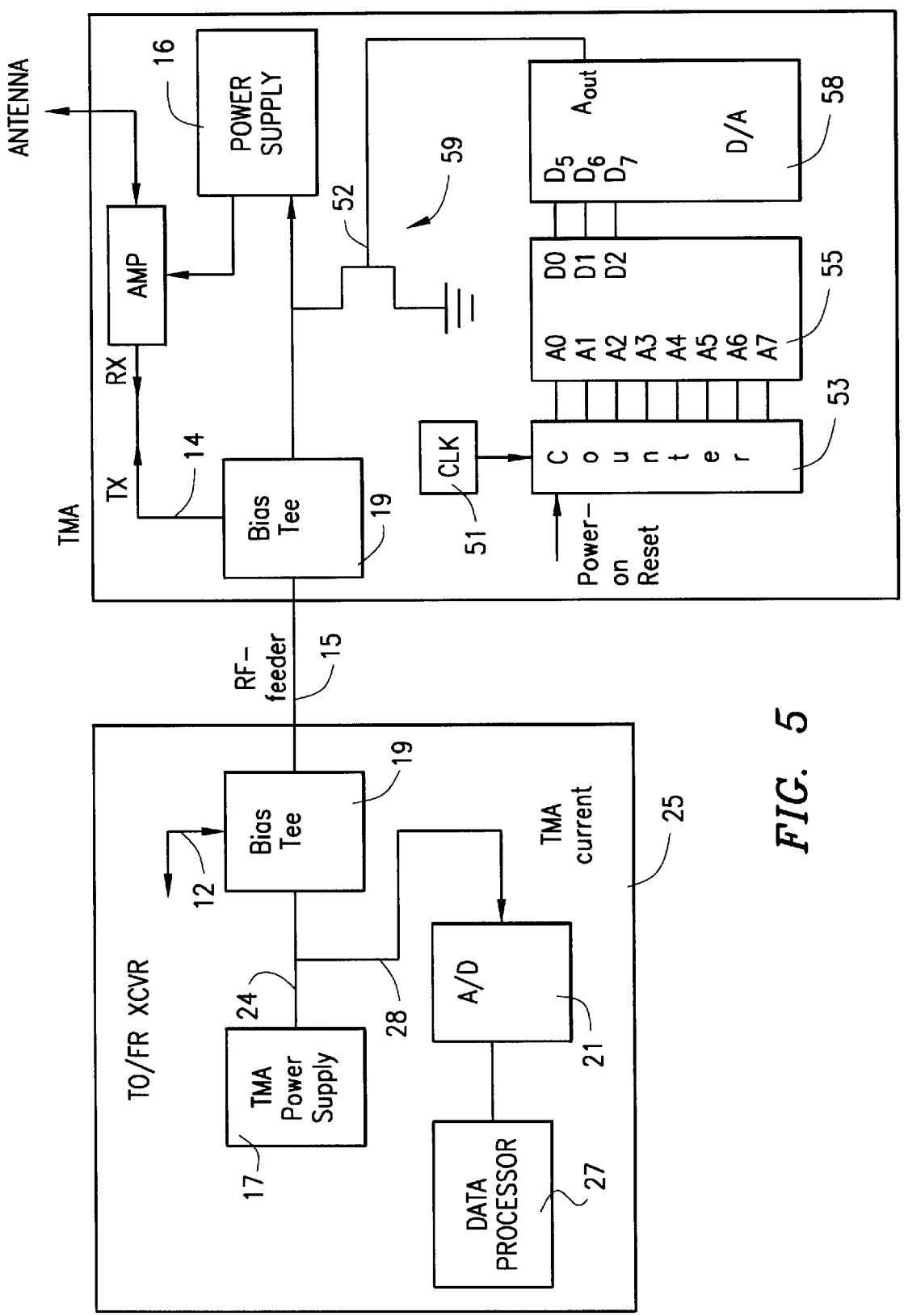
FIG. 5 is similar to FIG. 2, including a detailed example of the power supply current modulator of FIG. 2.

FIG. 5 illustrates diagrammatically an exemplary radio base transceiver station according to the invention. FIG. 5 is similar to FIG. 2, and includes a detailed example of the power supply current modulator 22 of FIG. 2. The exemplary power supply current modulator of FIG. 5 includes a clock 51 having a frequency that corresponds to the symbol rate of the data transfer illustrated in FIG. 4. The clock 51 is connected to a clock input of a counter 53. The counter 53 includes parallel outputs which are connected to address inputs A0–A7 of a memory 55. The memory 55 can be, for example, a non-volatile memory circuit. The memory 55 has data outputs D0–D2 which are connected to respective data inputs of a D/A converter 58. The three data outputs D0–D2 correspond to the eight current levels of the FIG. 4 example. The analog output Aout of the D/A converter is connected to a control input 52 of a transistor circuit 59 that can sink desired amounts of current and thereby vary the current drawn from the TMA power supply 17.

The parameter data for the tower mounted amplifier TMA is stored in the memory 55, and this stored parameter data is addressed by the counter circuit 53. In response to the clock circuit 51, the counter 53 steps through the addresses where the TMA parameter data is stored in the memory 55. Continuing with reference to the example data transfer of FIG. 4, the three-bit output of memory 55 can be converted by the D/A converter 58 into eight distinct control signals (e.g., control voltages) which cause the transistor circuit 59 to sink eight distinct amounts of current, thus resulting in eight distinct power supply current levels (see FIG. 4) drawn from the TMA power supply 17 and seen by the A/D converter 21. Although a transistor circuit is shown at 59 as a controllable current sink, other suitable controllable current sinks can be used as well.

The clock circuit 51 causes the counter circuit 53 to count up to the number of addresses needed for the complete message. For each memory location addressed by the parallel outputs of the counter circuit 53, the associated data bits are output to the D/A converter 58, which converts the bit pattern to a control signal for controlling the transistor circuit 59. Note that the stop (or idle) symbol 000 of FIG. 4 will, in this example, cause the transistor circuit 59 to assume a high impedance state so that the normal conventional operating current $i_n$ is drawn from TMA power supply 17. The counter 53 is reset at power on, and is also advantageously reset after the stop symbol is output. The counter is easily programmable to count through a sequence of addresses corresponding to the symbol sequence of FIG. 4, namely from stop symbol to stop symbol. Of course, the counter can be programmed to count through any desired sequence of addresses to transmit any desired number of symbol octets (and associated start and stop symbols) like the one shown in FIG. 4. The reset count preferably selects the stop symbol so no current is sunk at 59 while the counter is reset. The clock 51 can be started at power on (or at system restart) and halted after the stop symbol is output.

The data processor 27 can process the digital output of the A/D converter 21 in the following exemplary manner. Referring also to FIG. 4, before the start symbol (111) is detected, the data processor 27 can perform, for example, a five times oversampling of the digital output of the A/D converter 21. Once a change from the idle symbol to the start symbol is detected, the data processor sets sampling points for the remaining symbols in the data transfer at the middle of each of the successive symbol periods 0–7 illustrated in FIG. 4. The digital output from the A/D converter 21 (in this example a three-bit output) is read by the data processor 27 at each sampling point. When the data processor 27 detects the stop symbol (after symbol period 7 in this example), the five times oversampling can start again. After the data processor 27 has received the stop symbol, the data processor 27 can then assemble the message, for example, in the manner described above with respect to FIG. 4.

The above-described transfer of TMA parameter data from the tower mounted portion to the remainder portion can be executed, for example, whenever the tower mounted amplifier TMA is powered up or restarted.

It should be noted that the above-described current modulation techniques are also applicable to current in a dedicated power supply line rather than the combined power supply/RF feeder line 15.

Figure 6:
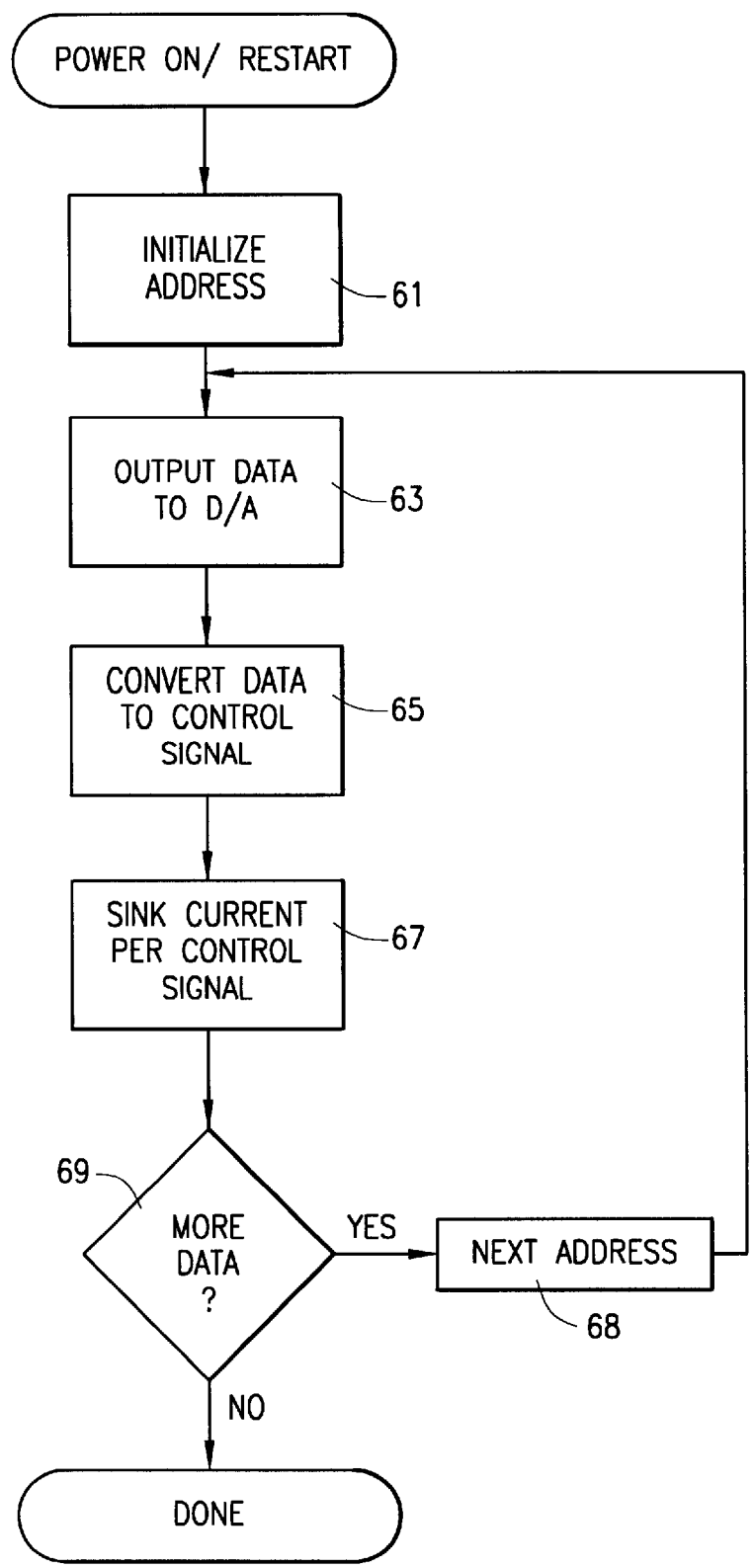
FIG. 6 illustrates in flow diagram format exemplary operations which can be performed by the power supply current modulators of FIGS. 2 and 5.

FIG. 6 illustrates exemplary operations performed by the power supply current modulator example of FIG. 5. After power on or restart, at 61 the counter 53 applies the initial address (e.g., the address of the start symbol for the first symbol octet) to the memory 55. Thereafter at 63, the memory 55 outputs the addressed data to the D/A converter 58. At 65, the D/A converter converts the digital data to an analog control signal for controlling the transistor circuit 59. At 67, the transistor circuit 59 sinks an amount of current corresponding to the control signal received from the D/A converter (and thus also corresponding to the digital data output from memory 55). If it is determined at 69 that there is more data to be transmitted, then the output of counter 53 is incremented to the next address at 68, and the procedure is repeated until it is determined at 69 that all data (including the final idle symbol) has been transmitted.

It will be apparent to workers in the art that the controllable current sink can also be readily controlled in the manner described above using a suitably programmed data processing apparatus to input digital data to the D/A converter 58.

It can be seen from the foregoing that the invention advantageously permits automatic transfer of TMA parameter data using power supply current modulation, and also enhances the data throughput by using multiple level coding.

Although exemplary embodiments of the present invention have been described above in detail, this does not limit the scope of the invention, which can be practiced in a variety of embodiments.

What is claimed is:

1. A tower-mountable radio frequency amplifier apparatus for use in a fixed-site radio transceiver station, comprising:
   an amplifier for amplifying radio frequency signals used in the fixed-site radio transceiver station;
   a power supply current path for receiving power supply current from an external source and providing the power supply current for use in powering operations of said amplifier; and
   a current modulator coupled to said power supply current path, said modulator having an input for receiving information about said apparatus which is provided as digital data, said modulator for modulating said power supply current in said power supply current path in response to said information about said apparatus, and said modulator including a digital-to-analog converter having a digital input to receive said digital data and having an analog output coupled to a control input of a controllable current sink apparatus.

2. The apparatus of claim 1, including a memory having said digital data stored therein and having a digital data output coupled to said digital input of said digital-to-analog converter.

3. The apparatus of claim 2, wherein said memory includes a non-volatile memory circuit.

4. The apparatus of claim 2, including a counter circuit having a count output coupled to an address input of said memory.

5. The apparatus of claim 1, including a radio frequency signal path coupled to said amplifier for carrying said radio frequency signals, said power supply current path including a portion of said radio frequency signal path.

6. The apparatus of claim 1, wherein said information includes at least one of a serial number associated with said apparatus, information about a filter frequency associated with said apparatus, information about a gain associated with said amplifier, and an alarm limit associated with said apparatus.

7. A fixed-site radio transceiver station, comprising:
   a tower-mounted amplifier apparatus including an amplifier for amplifying radio frequency signals used in said fixed-site radio transceiver station;
   a further apparatus located remotely from said tower-mounted amplifier apparatus, said further apparatus including a radio transceiver coupled to said amplifier for radio frequency signalling therebetween, said further apparatus including a power supply for providing power supply current to said tower-mounted amplifier apparatus;
   a power supply current path coupled between said power supply and said tower-mounted amplifier apparatus for carrying said power supply current to said tower-mounted amplifier apparatus; and
   a current modulator coupled to said power supply current path, said modulator having an input for receiving information about said tower-mounted amplifier apparatus, and said modulator for modulating said power supply current in said power supply current path in response to said information about said tower-mounted amplifier apparatus.

8. The apparatus of claim 7, wherein said further apparatus includes an apparatus coupled to said power supply current path to detect modulation of said power supply current and determine therefrom said information about said tower-mounted amplifier apparatus.

9. The apparatus of claim 7, wherein said fixed-site radio transceiver station is a base transceiver station for use in a GSM network.

10. A method of operating a tower-mounted radio frequency amplifier apparatus provided in a fixed-site radio transceiver station, comprising the steps of:

the amplifier apparatus receiving, from a source external to the amplifier apparatus, power supply current for use in powering operations of the amplifier apparatus;

providing information in the form of digital data about the amplifier apparatus from said source external to said amplifier apparatus; and transferring said information to a destination external to the amplifier apparatus, including modulating said externally sourced power supply current in response to said information, said modulating step including converting the digital data into analog signals and using the analog signals to determine selected amounts of current for use in sinking said selected amounts from the power supply current path.

11. The method of claim 10, wherein said step of providing information includes providing a plurality of binary bits, and wherein said modulating step includes producing in the externally sourced power supply current a plurality of current levels which represent respective groups of said binary bits.

12. The method of claim 10, wherein said receiving step includes the amplifier apparatus receiving the externally sourced power supply current via a power supply current path, and wherein said modulating step includes selectively sinking selected amounts of current from the power supply current path.

13. The method of claim 12, wherein said selectively sinking step includes operating a transistor circuit coupled to the power supply current path.

14. The method of claim 10, wherein said providing step includes obtaining said digital data from a memory.

15. The method of claim 14, wherein said obtaining step includes applying each of a plurality of addresses to an address input of the memory.

16. The method of claim 10, wherein said providing step includes providing at least one of a serial number associated with the amplifier apparatus, a filter frequency associated with the amplifier apparatus, a gain associated with the amplifier apparatus, and an alarm limit associated with the amplifier apparatus.

* * * * *